US007148734B2

(12) United States Patent
Tanzawa

(10) Patent No.: US 7,148,734 B2
(45) Date of Patent: Dec. 12, 2006

(54) ANALOG LEVEL SHIFTER

(75) Inventor: Toru Tanzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 10/968,145

(22) Filed: Oct. 20, 2004

(65) Prior Publication Data

US 2005/0110470 A1 May 26, 2005

(30) Foreign Application Priority Data

Oct. 21, 2003 (JP) ............................ 2003-360728

(51) Int. Cl.
*H03L 5/00* (2006.01)
*H02M 7/00* (2006.01)
*G05F 1/40* (2006.01)

(52) U.S. Cl. ........................................ 327/333; 363/73

(58) Field of Classification Search .................. 363/73, 363/74; 323/299, 303; 327/333–335, 355, 327/361–363; 326/61, 68, 80–83
See application file for complete search history.

(56) References Cited

U.S. PATENT DOCUMENTS 5,764,094 A 6/1998 Hatsuda
6,717,451 B1 * 4/2004 Klein et al. ................. 327/333
6,727,835 B1 * 4/2004 Blankenship et al. ....... 341/144
6,963,238 B1 * 11/2005 Mochizuki .................. 327/333
7,049,877 B1 * 5/2006 Clara et al. ................. 327/333

FOREIGN PATENT DOCUMENTS

JP 4-287411 10/1992

OTHER PUBLICATIONS

Yoshikazu Miyawaki, et al., "A 29-mm$^2$, 1.8-V-Only, 16-Mb DINOR Flash Memory with Gate-Protected-Poly-Diode (GPPD) Charge Pump", IEEE Journal of Solid-State Circuits, vol. 34, No. 11, Nov. 1999, pp. 1551-1556.

* cited by examiner

*Primary Examiner*—Matthew V. Nguyen
(74) *Attorney, Agent, or Firm*—Oblon, Spivak, McClelland, Maier & Neustadt, P.C.

(57) ABSTRACT

An analog level shifter includes a voltage output circuit which generates a first voltage and a second voltage in response to an input voltage and which adds the second voltage to the first voltage to output a third voltage, a voltage-current converting circuit to which the third voltage is inputted and which outputs a converted current proportional to the third voltage, a current subtracting circuit which subtracts a desired current from the converted current outputted by the voltage-current converting circuit, to output the resulting current, and a current-voltage converting circuit which generated a fourth voltage proportional to the current outputted by the current subtracting circuit.

18 Claims, 6 Drawing Sheets

ANALOG LEVEL SHIFTER

CROSS-REFERENCE TO RELATED APPLICATIONS

This application is based upon and claims the benefit of priority from prior Japanese Patent Application No. 2003-360728, filed Oct. 21, 2003, the entire contents of which are incorporated herein by reference.

BACKGROUND OF THE INVENTION

1. Field of the Invention

The present invention relates to an analog level shifter formed in a semiconductor integrated circuit. In particular, the present invention relates to an analog level shifter having a CMOS type operational amplifier.

2. Description of the Related Art

A known conventional analog level shifter is described in, for example, FIG. 7 of Y. Miyawaki et al., "A 29-$mm^2$, 1.8-V-only, 16-Mb DINOR Flash Memory with Gate-Protected-Poly-Diode (GPPD) Charge Pump," IEEE Journal of Solid-State Circuits, Vol. 34, No. 11, November 1999.

In the analog level shifter described in this document, an input voltage Vref is supplied to an operational amplifier. Then, a level-shifted voltage VO is obtained which is given by:

$$VO=VN+V\mathrm{ref}\times(R2/R1) \quad (1)$$

If a CMOS operational amplifier is used as the operational amplifier, the input voltage Vref is normally supplied to a gate electrode of an NMOS transistor. Accordingly, the input voltage Vref must be higher than a threshold voltage of the NMOS transistor. If the input voltage Vref is lower than the threshold voltage of the NMOS transistor, the output voltage VO does not have the value shown by Equation (1).

With progress in semiconductor processing technologies, MOS transistors have been increasingly fine-grained. Further, the operating voltages of circuits and thus voltage levels to be handled have been reduced. However, owing to the need for a reduction in off leak current, the threshold voltage of the NMOS transistor can only gradually be reduced compared to a decrease in supplied voltage. As a result, it is difficult to convert the level of a low analog voltage.

In spite of a low input voltage Vref, a PMOS input type operational amplifier is sometimes used in order to meet the relationship shown in Equation (1). In the PMOS input type operational amplifier, the input voltage Vref is supplied to a gate electrode of the PMOS transistor. However, three amplification stages including a final one are required to allow such a PMOS input type operational amplifier to operate correctly. Thus, with the PMOS input type operational amplifier, it is difficult to ensure stable operations. Further, a pattern area and an operating current increase.

BRIEF SUMMARY OF THE INVENTION

According to an aspect of the present invention, there is provided an analog level shifter including a voltage output circuit which generates a first voltage and a second voltage in response to an input voltage and which adds the second voltage to the first voltage to output a third voltage, a voltage-current converting circuit which has a current output node and to which the third voltage is inputted, the voltage-current converting circuit converting the third voltage into a current to output a first current proportional to the third voltage, from the current output node, a current subtracting circuit connected to the current output node to subtract a second current from the first current to output a third current, and a current-voltage converting circuit to which the third current is inputted and which converts the third current into a voltage to output a fourth voltage proportional to the third current.

DETAILED DESCRIPTION OF THE INVENTION

Figure 1:
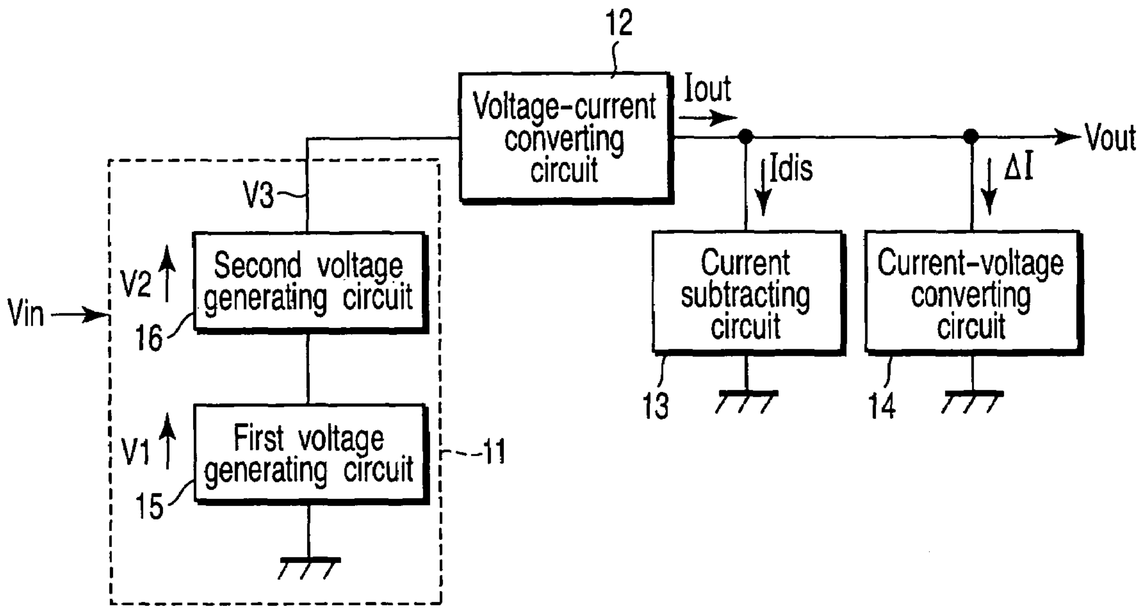
FIG. 1 is a block diagram of a first embodiment of an analog level shifter according to the present invention.

Embodiments of the present invention will be described below with reference to the drawings. Corresponding parts in the figures are denoted by the same reference numerals. Duplicate descriptions will be avoided.

First Embodiment

FIG. 1 shows a first embodiment of an analog level shifter according to the present invention. This analog level shifter is of a type that shifts the level of an analog input voltage to output an analog voltage. The analog level shifter is formed in a semiconductor integrated circuit (LSI). The analog level shifter includes a voltage output circuit 11, a voltage-current converting circuit 12, a current subtracting circuit 13, and a current-voltage converting circuit 14.

The voltage output circuit 11 includes a first voltage generating circuit 15 to which an input voltage Vin is inputted to generate a first voltage V1, and a second voltage generating circuit 16 to which the input voltage Vin is inputted to generate a second voltage V2. The voltage output circuit 11 adds the second voltage V2 to the first voltage V1 to output a third voltage V3. A third voltage V3 is inputted to the voltage-current converting circuit 12. The voltage-current converting circuit 12 then converts the third voltage V3 into a current to output a current Iout proportional to the third voltage V3, from a current output node. The current subtracting circuit 13 is connected between a current output node of the voltage-current converting circuit 12 and a first node to which a ground potential is provided. The current subtracting circuit 13 subtracts, from the current Iout, a current Idis corresponding to a current Iin flowing through the voltage output circuit 11 in accordance with the input voltage Vin, to output a difference current ΔI. The current-voltage converting circuit 14 is connected between a current output node of the voltage-current converting circuit and the first node. The current-voltage converting circuit 14 converts the current ΔI into a voltage to output a fourth voltage proportional to the current ΔI as an output voltage Vout.

Figure 2:
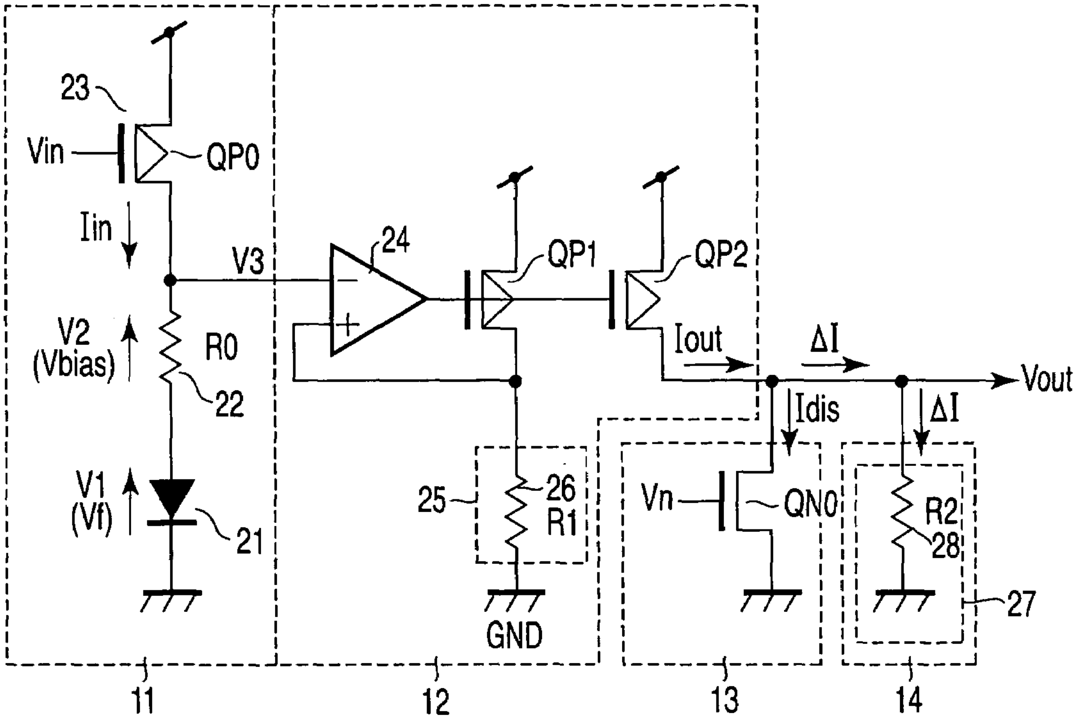
FIG. 2 is a circuit diagram showing a specific configuration of the analog level shifter in FIG. 1.

FIG. 2 shows a specific configuration of the analog level shifter in FIG. 1. The voltage output circuit 11 has a first voltage-current characteristic. The voltage output circuit 11 includes a first element, for example, a diode 21, which serves as a first voltage generating circuit 15, a second element, for example, a resistance element 22, which is connected in series with the diode 21 and which has a second voltage-current characteristic, the second element serving as a second voltage generating circuit 16, and a current source 23 consisting of a PMOS transistor QP0 in which a current path between a source and a drain is connected in series with the diode 21 and the resistance element 22 and in which the input voltage Vin is inputted to a gate electrode to output a fourth current Iin.

When the current Iin flows through the diode 21, a forward voltage Vf is generated across the diode 21 as the first voltage V1. When the current Iin flows through the resistance element 22, a bias voltage Vbias is generated across the resistance element 22 as the second voltage V2. In the embodiments described below, besides the diode 21, an NMOS transistor having a gate electrode and a source that are short-circuited, a resistance element, or the like, may be use.

The voltage-current converting circuit 12 includes an operational amplifier 24 having an inverting input terminal (−) to which the third voltage V3 is inputted, a first resistance circuit 25 connected between a noninverting input terminal (+) of the operational amplifier 24 and the first node, to which the ground potential GND is provided, a PMOS transistor QP1 for feedback control having a gate electrode connected to an output terminal of the operational amplifier 24, a source connected to a second node to which a supplied voltage VDD with a positive polarity is provided, and a drain connected to one end of a first resistance circuit 25, and a PMOS transistor QP2 for voltage-current conversion having a gate electrode connected to an output terminal of the operational amplifier 24, a source connected to the second node, and a drain connected to the output terminal for the current Iout. In this example, a single resistance element 26 is used as the first resistance circuit 25.

The current subtracting circuit 13 subtracts the current Idis, corresponding to the current Iin flowing through the current source 23, from the current Iout, outputted by the voltage-current converting circuit 12, to output the difference current ΔI (ΔI=Iout−Idis). In the present example, the current subtracting circuit 13 consists of an NMOS transistor QN0 in which a current path between a source and a drain is connected between the drain of the PMOS transistor QP2 and the first node and in which a bias voltage Vn is supplied to a gate electrode.

The current-voltage converting circuit 14 consists of a second resistance circuit 27 connected between the drain of the PMOS transistor QP2 and the first node. When the current ΔI flows through the second resistance circuit 27, the output voltage Vout is generated which is obtained by shifting the level of the first voltage V1 to be level-converted. In the present example, a single resistance element 28 is used as the second resistance circuit 27. A voltage having the same level as the first voltage V1 may be outputted as the voltage Vout depending on the settings of circuit constants.

Figure 3:
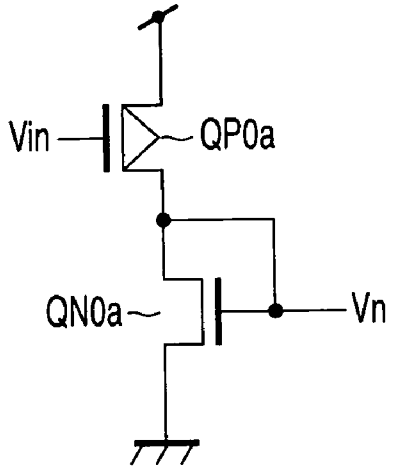
FIG. 3 is a circuit diagram showing an example of a bias voltage source used in the analog level shifter in FIG. 2.

FIG. 3 shows an example of a bias voltage source that generates a bias voltage Vn supplied to the gate electrode of the NMOS transistor QN0 in the current subtracting circuit 14 in FIG. 2.

The bias voltage source is configured so that sources and drains of a PMOS transistor QP0*a* and an NMOS transistor QN0*a* are connected in series between the second node (supplied voltage node) and the first node (ground potential node) and that a gate electrode and a drain of the NMOS transistor QN0*a* are connected together. The gate electrode of the PMOS transistor QP0*a* is supplied with the input voltage Vin, supplied to the gate electrode of the PMOS transistor QP0. The PMOS transistor QP0*a* is used as the current source 23. The gate potential Vn of the NMOS transistor QN0*a* is supplied to the gate electrode of the NMOS transistor QN0 of the current subtracting circuit 13 as a bias voltage.

Figure 4:
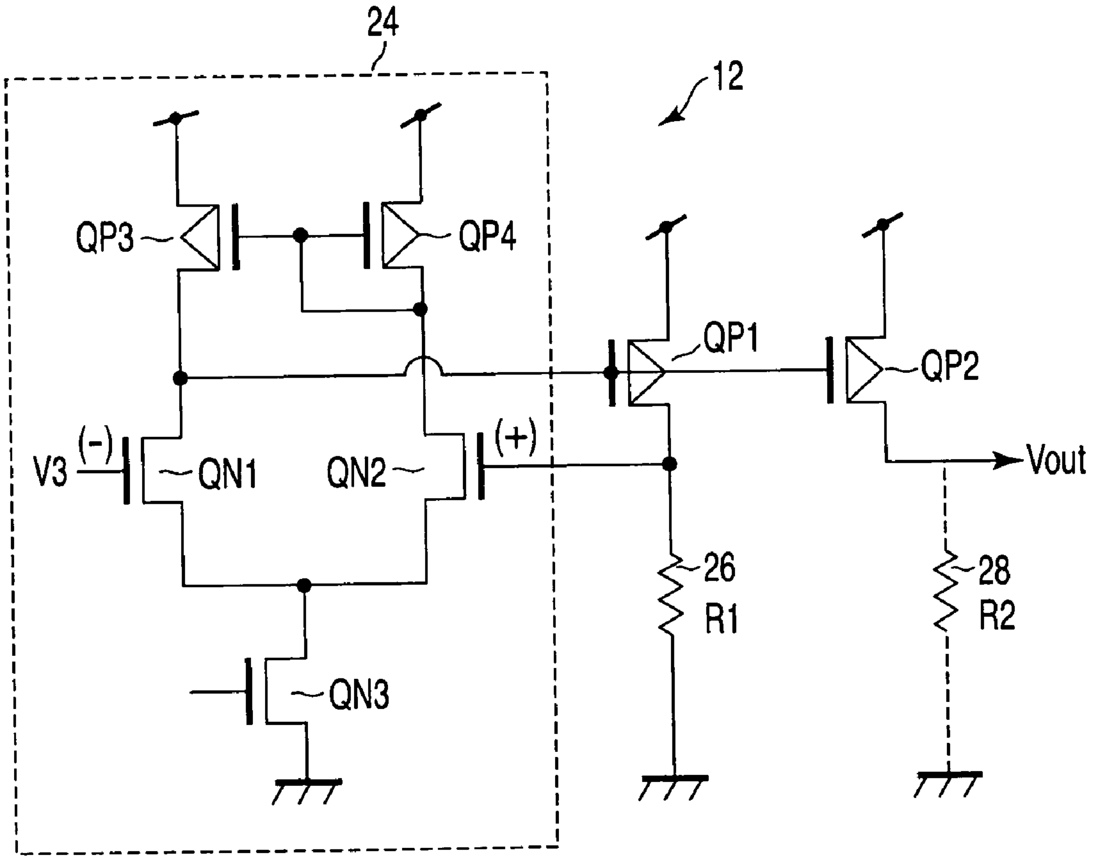
FIG. 4 is a circuit diagram showing a specific configuration of a voltage-current converting circuit in FIG. 2.

FIG. 4 shows a specific configuration of the voltage-current converting circuit 12, shown in FIG. 2. In FIG. 4, the operational amplifier 24 is composed of an NMOS transistor QN1 having a gate electrode to which the third voltage V3 in FIG. 2 is supplied, an NMOS transistor QN2 constituting a differential pair with the NMOS transistor QN1, an NMOS transistor QN3 for a constant current source which allows a constant current to flow through the differential pair, and a current mirror type load consisting of the PMOS transistor QP3 and QP4.

Here, the third voltage V3 is set to be higher than a threshold voltage of the NMOS transistor QN1. The operational amplifier 24 provides a negative feedback such that the voltage of the noninverting input terminal (+) is equal to the third voltage V3 of the inverting input terminal (−), that is, the third voltage V3 is added to the resistance element 26.

The output voltage from the operational amplifier 24 controls the gate electrodes of the PNOS transistors QP1 and QP2. The current Iout flows through the PMOS transistor QP2; the current Iout has a value determined by multiplying the current flowing through the PMOS transistor QP1 by the size ratio of the PMOS transistor QP1 to the PMOS transistor QP2.

In the analog level shifter in FIG. 2, the current subtracting circuit 13 reduces the current Iout, outputted by the voltage-current converting circuit 12, that is, and subtracts the current Idis corresponding to Iin from the current Iout. Then, the difference current ΔI flows through the voltage-current converting circuit 14. The voltage-current converting circuit 14 thus converts the difference current ΔI into the output voltage Vout. In this case, the resistance element 22 is composed of the same constituent material as the resistance element 26 in the first resistance circuit 25 and the resistance element 28 in the second resistance circuit 27. Thus, the value of the output voltage Vout can be corrected to one obtained by subtracting, from this value, a voltage approximate to a voltage Vbias generated across the resistance element 22. This correcting operation will be quantitatively described below.

If the PMOS transistor QP1 and the PMOS transistor QP2 have an equal element size, the output voltage Vout is given by Equation (2), shown below. Here, the resistance elements 26 and 28 have resistance values R1 and R2, respectively.

$$\begin{aligned} Vout &= \Delta I \times R2 \quad (2) \\ &= (Iout - Idis) \times R2 \\ &= Iout \times R2 - Idis \times R2 \\ &= \{(V1 + V2)R2/R1\} - Idis \times R2 \\ &= (V1 \times R2/R2) + (V2 \times R2/R1) - Idis \times R2 \\ &= (V1 \times R2/R1) + \Delta V \\ \Delta V &= (V2 \times R2/R1) - Idis \times R2. \end{aligned}$$

Then, provided that Idis=V2/R1, ΔV=0.

The Vout is given by:

$$Vout = V1 \times R2/R1 \quad (3)$$

In other words, in this case, the output voltage Vout obtained has the same magnitude as the conventional output voltage VO, obtained when VN=0.

Provided that Idis=V2/R0 (R0 is the value for the resistance element 22 and is different from R1), ΔV is given by:

$$\begin{aligned} \Delta V &= (V2 \times R2/R1) - (V2 \times R2/R0) \quad (4) \\ &= (V2 \times R2)\{(1/R1) - (1/R0)\} \end{aligned}$$

Specifically, in this case, the output voltage Vout is obtained which has a magnitude determined by shifting the output voltage VO from the analog level shifter according to the conventional example, by ΔV, shown by Equation (4).

Consequently, in the analog level shifter in FIG. 1, the value of the output voltage Vout can be adjusted so as to have an offset ΔV, shown by Equation (4). In other words, it is possible to increase the degree of freedom of setting of the level of the output voltage. Further, in a special case where R0=R1, the value of the output voltage Vout can be set so as not to have the offset ΔV, as shown in Equation (3).

Then, it is assumed that the first voltage V1 is inputted directly to the operational amplifier 24. With progress in semiconductor processing technologies, MOS transistors are increasingly fine-grained. As a result, the operating voltages of circuits and thus voltage levels to be handled are reduced. This reduces the first voltage V1 below the threshold voltage of the NMOS transistor QN1 in the operational amplifier 24. Then, the relationship shown in Equation (2) is not established. However, in the analog level shifter according to the first embodiment, the third voltage V3, obtained by adding the second voltage V2 to the first voltage V1, is inputted to the gate electrode of the NMOS transistor QN1 in the operational amplifier 24. Therefore, the relationship shown by Equation (2) is established in spite of a certain decrease in the operating voltage of the circuit.

Figure 5:
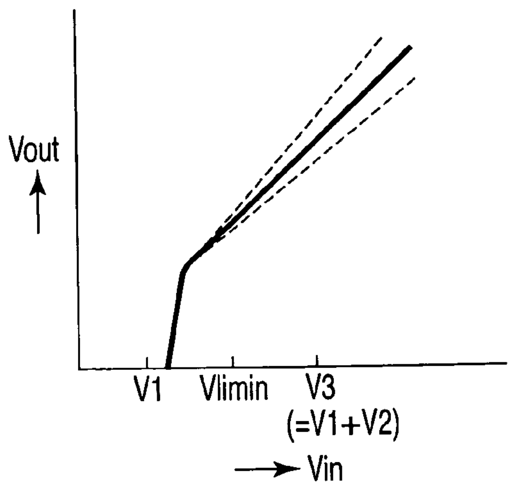
FIG. 5 is a characteristic diagram showing an example of an I/O characteristic of the analog level shifter in FIG. 2.

This will be described below. FIG. 5 shows an example of the I/O characteristic of the analog level shifter in FIG. 2.

With the analog level shifter according to the first embodiment, the circuit operations are ensured by setting the value of the second voltage V2 so that the third voltage V3, obtained by adding the second voltage V2 (Vbias) to the first voltage V1, is included in a proportional area of the I/O characteristic as shown in FIG. 5, that is, the third voltage V3 is equal to or higher than an operational range Vlimn of the operational amplifier 24. This allows the relationship shown by Equations (2) and (3) to be established. Further, the output voltage Vout can be set at a desired value by setting the ratio of R2 to R1 at a desired value. As a result, the first voltage V1, which is equal to or lower than a dynamic range of the operational amplifier 24, can be level-converted into the output voltage Vout.

Further, the gradient of the output voltage Vout varies with the value of the ratio of R2 to R1 in Equation (3), as shown by a broken line in the I/O characteristic shown in FIG. 5.

With the analog level shifter according to the first embodiment, the voltage to undergo a level conversion is increased and converted into a current. Then, for example, the current corresponding to the increase is subtracted from the current obtained by the conversion. The resulting current is converted into a voltage. This enables the level of the analog signal to be shifted even if the operational amplifier has a narrow dynamic range as shown in FIG. 4. Therefore, an analog level shifter can be provided which can be operated by a reduced voltage, which requires reduced power, and which has a reduced pattern area.

Second Embodiment

In the description of the analog level shifter according to the first embodiment, the first and second resistance circuits 25 and 27 are composed of the single resistance elements 26 and 28, respectively. In contrast, in an analog level shifter according to a second embodiment, the resistances of the first and second resistance circuits 25 ad 27 can be set at desired values.

Figure 6:
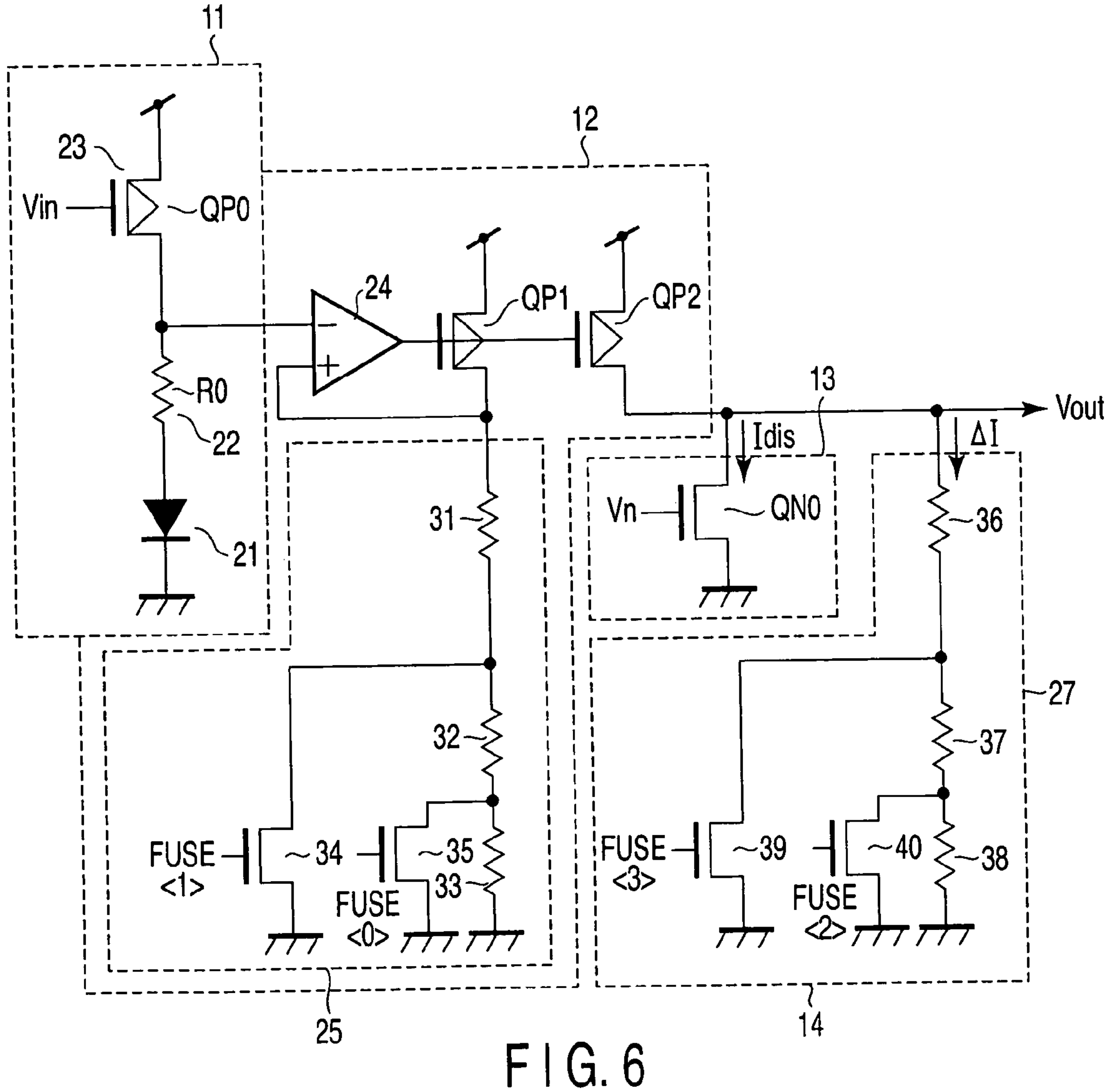
FIG. 6 is a block diagram of a second embodiment of an analog level shifter according to the present invention.

In the analog level shifter according to the second embodiment, shown in FIG. 6, each of the first and second resistance circuits 25 and 27 includes a plurality of resistance elements connected together in series, and a plurality of switch elements each connected between a series connected node of the corresponding resistance element and the first node. In the present example, the first resistance circuit 25 is provided with three resistance elements 31, 32, and 33 and two NMOS transistors 34 and 35 serving as switch elements. Data FUSE<1> is inputted to a gate electrode of the NMOS transistor 34. Data FUSE<0> is inputted to a gate electrode of the NMOS transistor 35. The second resistance circuit 27 is provided with three resistance elements 36, 37, and 38 and two NMOS transistors 39 and 40 serving as switch elements. Data FUSE<3> is inputted to a gate electrode of the NMOS transistor 39. Data FUSE<2> is inputted to a gate electrode of the NMOS transistor 40.

As each of the data FUSE<0>, FUSE<1>, FUSE<2>, and FUSE<3>, for example, 2-bit trimming data can be used which is stored in a fuse element blows by irradiation with laser beams. "H" level data is provided to the gate electrode of a selected one of the NMOS transistors in each of the first and second resistance circuits 25 and 27. "L" level data is provided to the gate electrode of the unselected NMOS transistor. The resistance value of each of the first and second resistance circuits 25 and 27 can be set by controllably turning on and off each of the two NMOS transistors in accordance with a combination of the logic levels of the 2-bit data FUSE<0> and FUSE<1> or FUSE<2> and FUSE<3>.

The resistance value can be trimmed by forming a conductive path between the gate electrodes of the NMOS transistors 34, 35, 39, and 40 and the "H" level node or "L" level node after an inspection step of a manufacture stage, instead of using the trimming data FUSE <0>, FUSE<1>, FUSE<2>, and FUSE<3>.

In addition to the trimming of the resistance value, the analog level shifter according to the present embodiment can execute a change of the dependence of the output voltage Vout on the temperature.

Figure 7:
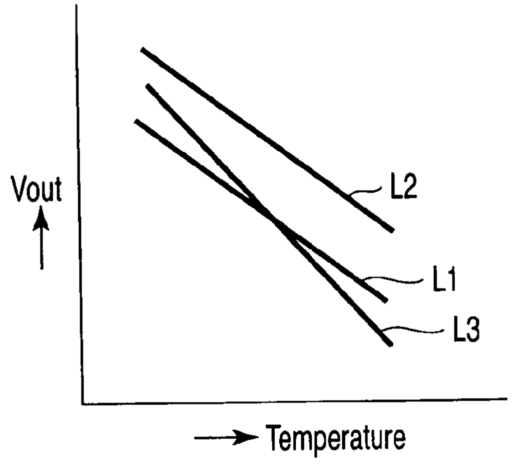
FIG. 7 is a characteristic diagram showing a temperature characteristic of an output voltage from the analog level shifter in FIG. 6.

FIG. 7 is a characteristic diagram showing the dependence of the output voltage Vout on the temperature in the analog level shifter according to the present embodiment. On the assumption that in the analog level shifter in FIG. 6, the offset voltage of the operational amplifier 24 or the characteristics of a circuit using the output voltage Vout may vary with chips, a temperature characteristic L1 shown in FIG. 7 can be changed to a temperature characteristic L2 or L3 in accordance with the trimming data FUSE<0>, FUSE<1>, FUSE<2>, and FUSE<3>.

In this case, if for example, a temperature coefficient for the output voltage Vout is set at a target value and the absolute value for the output value Vout is to be increased, the resistance values of the first and second resistance circuits 25 and 27 are adjusted. The adjusted values are maintained so as to make the value of the ratio of R2 to R1 in Equation (3) fixed, while the value of the R2 is reduced. This reduces the value of the item Idis×R2 in Equation (3). It is thus possible to increase the absolute value of the output voltage Vout as shown by the temperature characteristic L2, shown in FIG. 7.

Further, by independently adjusting R1 and R2 and independently adjusting R2/R1 and R1 or R2 in Equation (3), it is possible to adjust the temperature coefficient and absolute value of the output voltage Vout as shown by the temperature characteristic L3.

Third Embodiment

Figure 8:
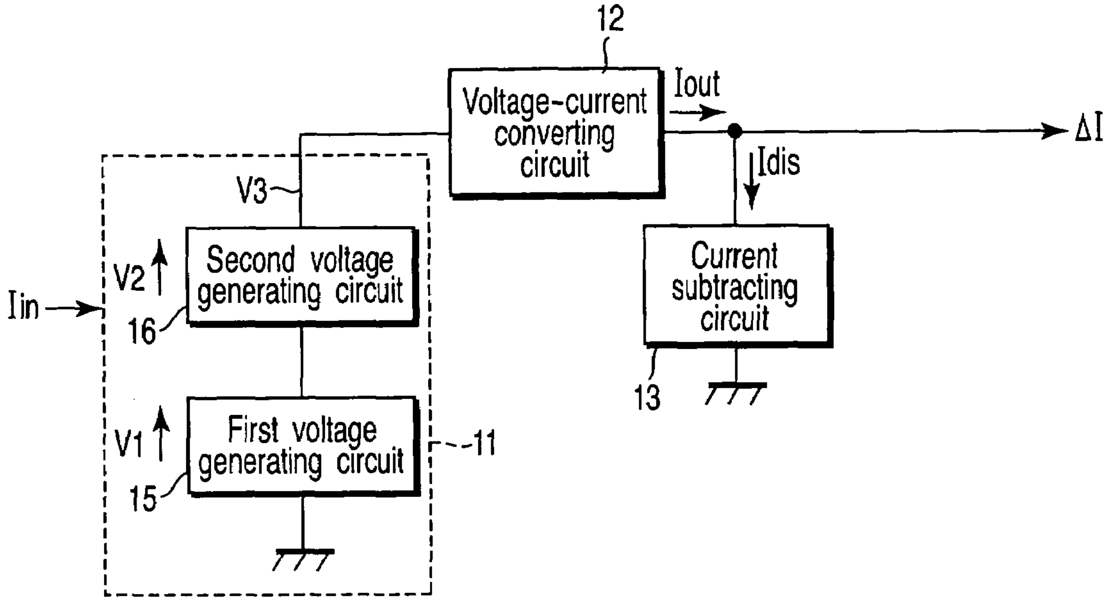
FIG. 8 is a block diagram of a third embodiment of an analog level shifter according to the present invention.

FIG. 8 is a block diagram of a third embodiment of an analog level shifter according to the present invention. This analog level shifter is of a type that shifts the level of the input current Iin to output a current. The analog level shifter is formed in a semiconductor integrated circuit (LSI). This analog level shifter differs from the one shown in FIG. 1 in that the current Iin is inputted to the voltage output circuit 11 and that the current-voltage converting circuit 14 is not provided.

Figure 9:
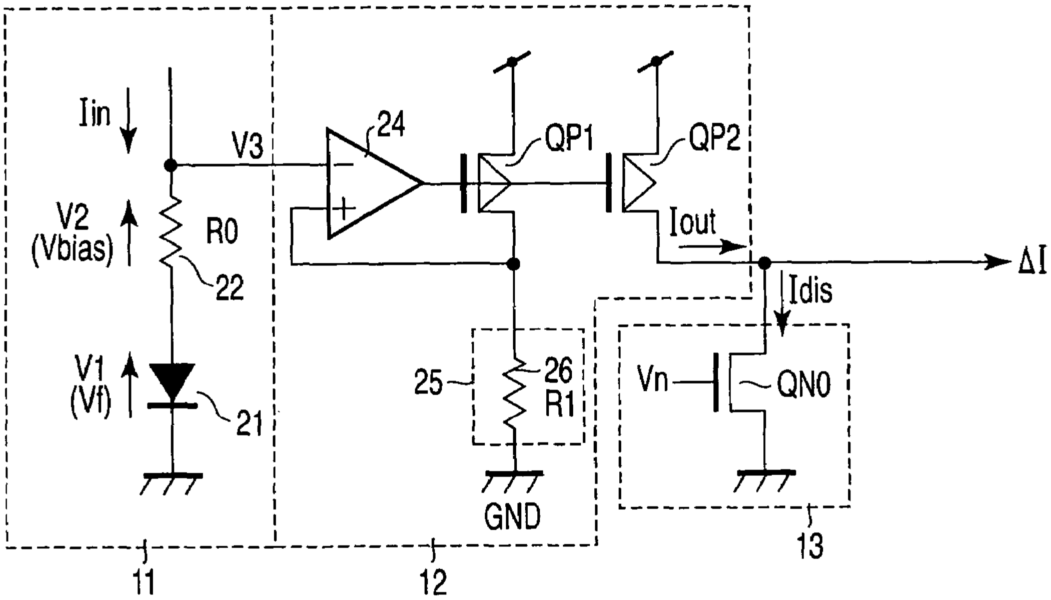
FIG. 9 is a circuit diagram showing a specific configuration of the analog level shifter in FIG. 8.

FIG. 9 shows an example of a specific circuit configuration of the analog level shifter in FIG. 8. The voltage output circuit 11 is not provided with the current source 23. The input current Iin is supplied to the diode 21 and resistance element 22.

In the analog level shifter in FIG. 9, the input current Iin flows through the diode 21 and resistance element 22 to generate a first voltage V1 across the diode 21, constituting the first voltage generating circuit 15. A second voltage V2 is thus generated across the resistance element 22, constituting the second voltage generating circuit 16. Then, the voltage output circuit 11 adds the second voltage V2 to the first voltage V1 to output a third voltage V3. The third voltage V3 is supplied to the operational amplifier 24 in the voltage-current converting circuit 12 to output a current Iout. Then, the current subtracting circuit 13 reduces the current Iout, that is, subtracts the current Idis corresponding to Iin from the current Iout, to output a difference current ΔI. In this case, the resistance element 22 is composed of the same constituent material as the resistance element 26 in the first resistance circuit 25.

In this embodiment, the first resistance circuit 25 is composed of the single resistance element 26. However, the resistance value may also be trimmed by constructing the first resistance circuit 25 using a plurality of resistors and a plurality of switches as in the case of the analog level shifter according to the second embodiment, shown in FIG. 6.

Fourth Embodiment

Figure 10:
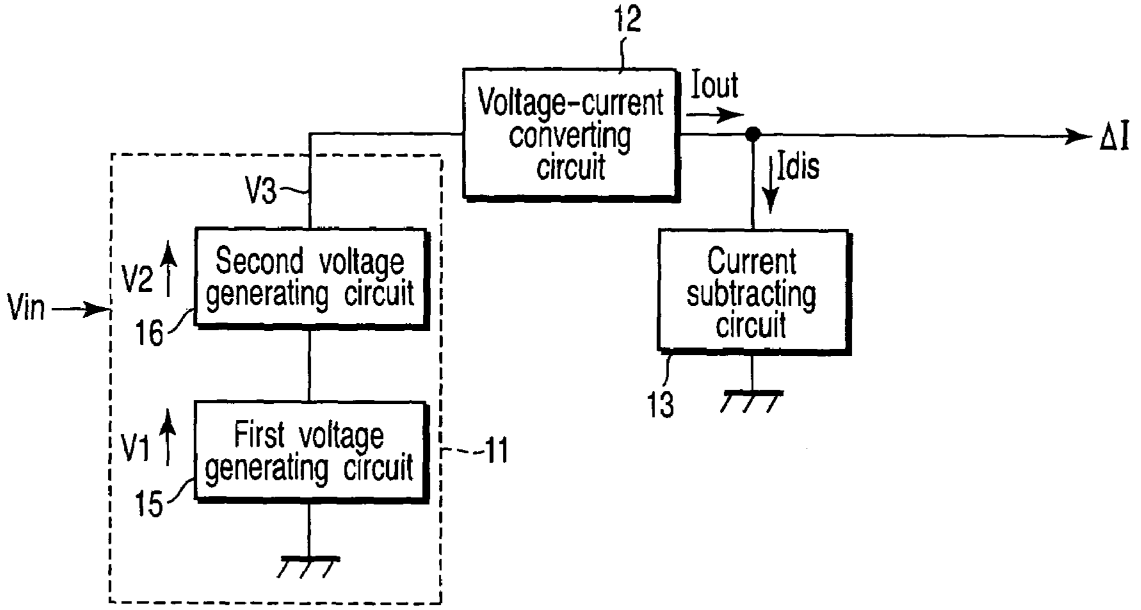
FIG. 10 is a block diagram of a fourth embodiment of an analog level shifter according to the present invention.

FIG. 10 is a block diagram of a fourth embodiment of an analog level shifter according to the present invention. This analog level shifter is of a type that shifts the level of the input voltage Vin to output a current. The analog level shifter is formed in a semiconductor integrated circuit (LSI). This analog level shifter differs from the one shown in FIG. 1 in that the current-voltage converting circuit 14 is not provided.

Figure 11:
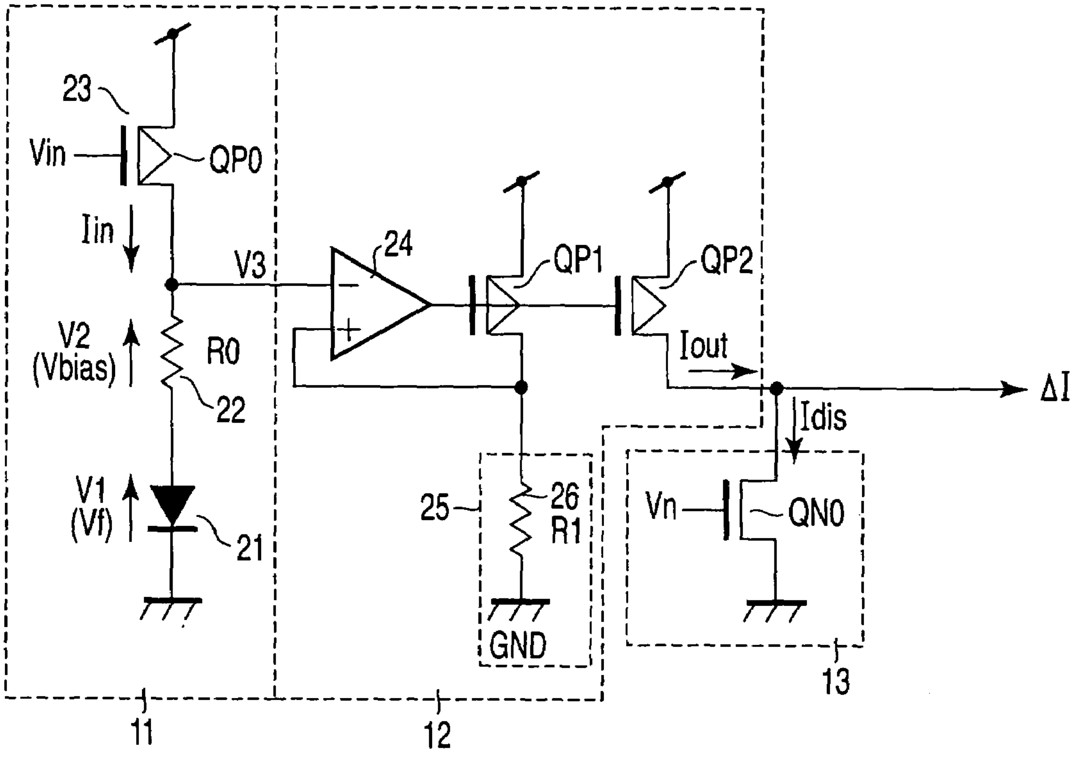
FIG. 11 is a circuit diagram showing a specific configuration of the analog level shifter in FIG. 10.

FIG. 11 shows an example of a specific circuit configuration of the analog level shifter in FIG. 10.

In the analog level shifter in FIG. 11, the current Iin flows through the PMOS transistor QP0 for the current source and then through the diode 21 and resistance element 22. Thus, a first voltage V1 is generated across the diode 21, while a second voltage V2 is thus generated across the resistance element 22. Then, the second voltage V2 is added to the first voltage V1, and a third voltage V3 is outputted. The third voltage V3 is supplied to the operational amplifier 24 in the voltage-current converting circuit 12 to output a current Iout. Then, the current subtracting circuit 13 reduces the current Iout, that is, subtracts the current Idis corresponding to Iin from the current Iout, to output a difference current ΔI. In this case, the resistance element 22 is composed of the same constituent material as the resistance element 26 in the first resistance circuit 25.

In this embodiment, the first resistance circuit 25 is composed of the single resistance element 26. However, the resistance value may also be trimmed by constructing the first resistance circuit 25 using a plurality of resistors and a plurality of switches as in the case of the analog level shifter according to the second embodiment, shown in FIG. 6.

Fifth Embodiment

Figure 12:
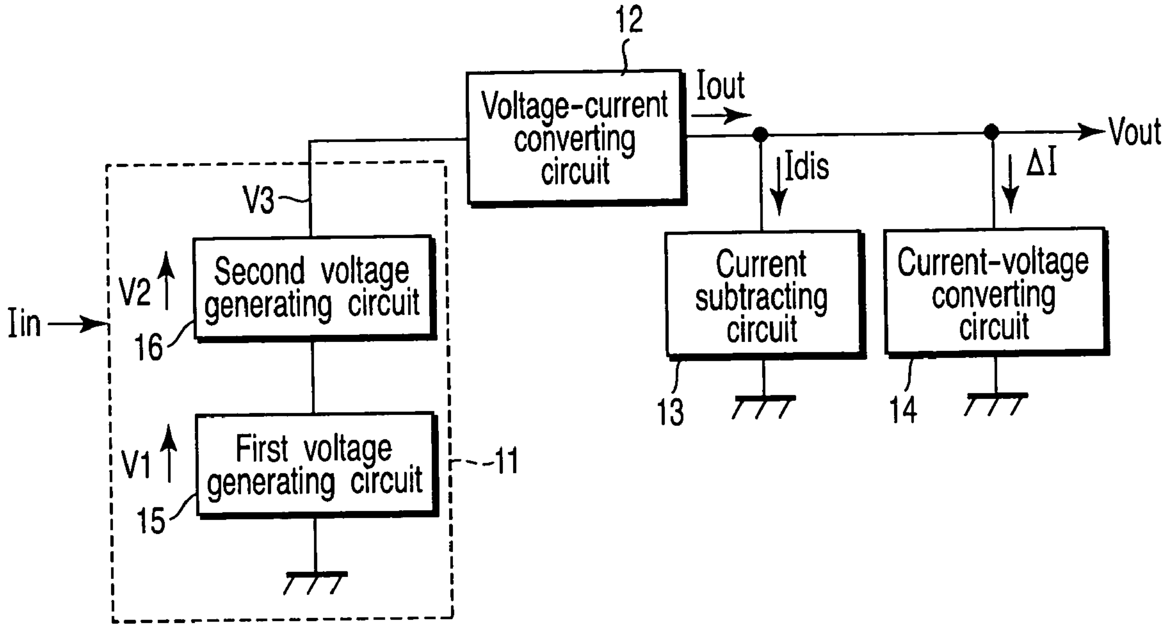
FIG. 12 is a block diagram of a fifth embodiment of an analog level shifter according to the present invention.

FIG. 12 is a block diagram of a fifth embodiment of an analog level shifter according to the present invention. This analog level shifter is of a type that shifts the level of the input current Iin to output a voltage. The analog level shifter is formed in a semiconductor integrated circuit (LSI).

Figure 13:
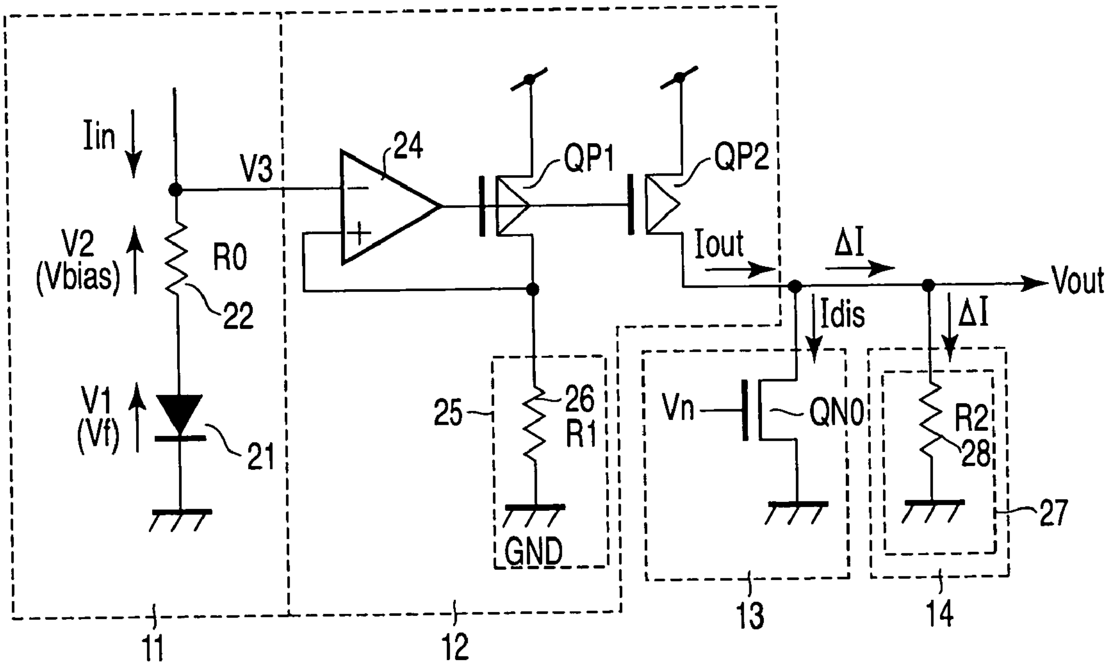
FIG. 13 is a circuit diagram showing a specific configuration of the analog level shifter in FIG. 12.

FIG. 13 shows an example of a specific circuit configuration of the analog level shifter in FIG. 12. This analog level shifter differs from the one shown in FIG. 9 in that the second resistance circuit 27, constituting the current-voltage converting circuit 14, is provided.

In the analog level shifter in FIG. 13, the input current Iin flows through the diode 21 and resistance element 22 to generate a first voltage V1 across the diode 21 and a second voltage V2 across the resistance element 22. Then, the second voltage V2 is added to the first voltage V1, and a third voltage V3 is outputted. The third voltage V3 is supplied to the operational amplifier 24 in the voltage-current converting circuit 12 to output a current Iout. Then, the current subtracting circuit 13 reduces the current Iout, that is, subtracts the current Idis corresponding to Iin from the current Iout, to output a difference current ΔI. Then, the second resistance circuit 27, constituting the current-voltage converting circuit 14, converts the difference current ΔI into a voltage to output an output voltage Vout.

In this case, the resistance element 22 is composed of the same constituent material as the resistance elements 26 and 28 in the first and second resistance circuits 25 and 27, respectively.

In this embodiment, the first and second resistance circuits 25 and 27 are composed of the single resistance elements 26 and 28, respectively. However, the resistance value may also be trimmed by constructing each of the first and second resistance circuits 25 and 27 using a plurality of resistors and a plurality of switches as in the case of the analog level shifter according to the second embodiment, shown in FIG. 6.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog level shifter comprising:

a voltage output circuit which generates a first voltage and a second voltage in response to an input voltage and which adds the second voltage to the first voltage to output a third voltage;

a voltage-current converting circuit which has a current output node and to which the third voltage is inputted, the voltage-current converting circuit converting the third voltage into a current to output a first current proportional to the third voltage, from the current output node;

a current subtracting circuit connected to the current output node to subtract a second current from the first current to output a third current; and a current-voltage converting circuit to which the third current is inputted and which converts the third current into a voltage to output a fourth voltage proportional to the third current.

2. The analog level shifter according to claim 1, wherein the voltage output circuit includes:

a first element having a first voltage-current characteristic;

a second element connected in series with the first element and having a second voltage-current characteristic; and a current source connected in series with the first element and the second element to output a fourth current in accordance with the input voltage, wherein when the fourth current flows through the first element, the first voltage is generated across the first element, and when the fourth current flows through the second element, the second voltage is generated across the second element.

3. The analog level shifter according to claim 2, wherein the first element is a diode and the second element is a resistor.

4. The analog level shifter according to claim 1, wherein the voltage-current converting circuit includes:

an operational amplifier having an inverting input terminal, a noninverting input terminal, and an output terminal, the third voltage being inputted to the noninverting input terminal;

a first resistance circuit having one end and the other end, the one end being connected to the noninverting input terminal of the operational amplifier, the other end being connected to a first node to which a first potential is provided;

a first transistor of a first conductive type having a gate electrode, a source, and a drain, the gate electrode being connected to the output terminal of the operational amplifier, the source being connected to a second node to which a second potential is provided, the drain being connected to the one end of the first resistance circuit; and a second transistor of the first conductive type having a gate electrode, a source, and a drain, the gate electrode being connected to the output terminal of the operational amplifier, the source being connected to the second node, the drain being connected to the current output node.

5. The analog level shifter according to claim 4, wherein the operational amplifier includes:

a third and fourth transistors of a second conductive type having gate electrodes connected to the inverting input terminal and the noninverting input terminal, respectively, to constitute a differential pair; and a fifth and sixth transistors of the first conductive type connected to the third and fourth transistors, respectively, to constitute a current mirror type load.

6. The analog level shifter according to claim 4, wherein the current subtracting circuit has a seventh transistor of the second conductive type having a gate electrode, a source, and a drain, the gate electrode being supplied with a bias voltage, the source being connected to the first node, the drain being connected to the current output node.

7. The analog level shifter according to claim 2, wherein a value of the second current is equal to a value of the fourth current outputted by the current source.

8. The analog level shifter according to claim 4, wherein the current-voltage converting circuit includes a second resistance circuit connected between the current output node and the first node.

9. The analog level shifter according to claim 8, wherein the first resistance circuit and/or the second resistance circuit includes a single resistance element.

10. The analog level shifter according to claim 8, wherein the first resistance circuit and/or the second resistance circuit includes:

a plurality of resistance elements connected together in series; and a plurality of switch elements each inserted between a series connected node of a corresponding one of the plurality of resistance elements and the first node, wherein the plurality of switch elements are controllably turned on and off to adjust a resistance value of the first resistance circuit and/or the second resistance circuit.

11. An analog level shifter comprising:

a voltage output circuit which generates a first voltage and a second voltage in response to an input current and which adds the second voltage to the first voltage to output a third voltage;

a voltage-current converting circuit which has a current output node and to which the third voltage is inputted, the voltage-current converting circuit converting the third voltage into a current to output a first current proportional to the third voltage, from the current output node; and a current subtracting circuit connected to the current output node to subtract a second current from the first current to output a third current.

12. The analog level shifter according to claim 11, wherein the voltage output circuit includes:

a first element which has a first voltage-current characteristic and to which the input current is supplied; and a second element connected in series with the first element and having a second voltage-current characteristic, the second element being supplied with the input current, wherein when the input current flows through the first element, the first voltage is generated across the first element, and when the input current flows through the second element, the second voltage is generated across the second element.

13. The analog level shifter according to claim 12, wherein the first element is a diode and the second element is a resistor.

14. The analog level shifter according to claim 11, wherein the voltage-current converting circuit includes:

an operational amplifier having an inverting input terminal, a noninverting input terminal, and an output terminal, the third voltage being inputted to the noninverting input terminal;

a resistance circuit having one end and the other end, the one end being connected to the noninverting input terminal of the operational amplifier, the other end being connected to a first node to which a first potential is provided;

a first transistor of a first conductive type having a gate electrode, a source, and a drain, the gate electrode being connected to the output terminal of the operational amplifier, the source being connected to a second node to which a second potential is provided, the drain being connected to the one end of the resistance circuit; and a second transistor of the first conductive type having a gate electrode, a source, and a drain, the gate electrode being connected to the output terminal of the operational amplifier, the source being connected to the second node, the drain being connected to the current output node.

15. The analog level shifter according to claim 14, wherein the operational amplifier includes:

a third and fourth transistors of a second conductive type having gate electrodes connected to the inverting input terminal and the noninverting input terminal, respectively, to constitute a differential pair; and a fifth and sixth transistors of the first conductive type connected to the third and fourth transistors, respectively, to constitute a current mirror type load.

16. The analog level shifter according to claim 15, wherein the current subtracting circuit has a seventh transistor of the second conductive type having a gate electrode, a source, and a drain, the gate electrode being supplied with a bias voltage, the source being connected to the first node, the drain being connected to the current output node.

17. The analog level shifter according to claim 14, wherein the resistance circuit includes a single resistance element.

18. The analog level shifter according to claim 14, wherein the resistance circuit includes:

a plurality of resistance elements connected together in series; and a plurality of switch elements each inserted between a series connected node of a corresponding one of the plurality of resistance elements and the first node, wherein the plurality of switch elements are controllably turned on and off to adjust a resistance value of the first resistance circuit.

* * * * *